United States Patent [19]
Nakamura

[11] Patent Number: 5,523,585
[45] Date of Patent: Jun. 4, 1996

[54] SEMICONDUCTOR DEVICE HAVING A SUPERLATTICE STRUCTURE

[75] Inventor: Satoshi Nakamura, Kawasaki, Japan

[73] Assignee: Fujitsu Limited, Kawasaki, Japan

[21] Appl. No.: 341,957

[22] Filed: Nov. 16, 1994

[30] Foreign Application Priority Data

Nov. 17, 1993 [JP] Japan ................. 5-287183

[51] Int. Cl.⁶ ..................... H01L 27/12; H01L 27/082
[52] U.S. Cl. ..................... 257/20; 257/24; 257/27
[58] Field of Search .................... 257/15, 17, 20, 257/24, 27

[56] References Cited

U.S. PATENT DOCUMENTS

| | | | |
|---|---|---|---|
| 4,591,889 | 5/1986 | Gossard et al. | 257/15 |
| 5,212,404 | 5/1993 | Awano | 257/5 |

FOREIGN PATENT DOCUMENTS

| | | | |
|---|---|---|---|
| 2-26078 | 1/1990 | Japan | 257/20 |
| 4-3942 | 1/1992 | Japan | 257/24 |
| 5-3214 | 1/1993 | Japan | |

*Primary Examiner*—Donald L. Monin, Jr.
*Attorney, Agent, or Firm*—Armstrong, Westerman, Hattori, McLeland & Naughton

[57] ABSTRACT

A semiconductor device according to the invention has a channel layer, which is sandwiched by a first and a second barrier layers, and an electron supply layer for supplying the channel layer with electrons through at least one of the barrier layers. The channel layer has a superlattice structure formed by periodically repeating, in the direction of electron movement, a first and a second semiconductor material regions, each of which has a different band gap from the other. With this superlattice structure, a plurality of mini-bands are formed within a potential well, which is formed by the first and second barrier layers. Impurity concentration of the electron supply layer is so controlled that electrons may move mainly within a mini-band in which effective mass of electrons is minimum among those mini-bands. Thus, a semiconductor device having a high electron mobility in the room temperature can be obtained without requiring high purification of crystal.

11 Claims, 12 Drawing Sheets

FIG. 8

| | |
|---|---|
| $E_3{}^{max} = 315.4\,[meV]$<br>$E_3{}^{min} = 277.9\,[meV]$<br>$E_2{}^{max} = 136.3\,[meV]$<br>$E_2{}^{min} = 118.9\,[meV]$<br>$E_1{}^{max} = 33.3\,[meV]$<br>$E_1{}^{min} = 28.7\,[meV]$ | $m_3{}^{eff} = 0.0108\,m_e$<br>$m_2{}^{eff} = 0.0119\,m_e$<br>$m_1{}^{eff} = 0.0921\,m_e$<br>$m_{GaAs} = 0.067\,m_e$<br>$m_{InAs} = 0.023\,m_e$ |

1

SEMICONDUCTOR DEVICE HAVING A SUPERLATTICE STRUCTURE

BACKGROUND OF THE INVENTION

1. Field of the Invention

The present invention relates to a semiconductor device and particularly to a semiconductor device having a superlattice structure.

2. Description of the Related Art

A high electron mobility transistor (hereinafter referred to as HEMT) has an electron moving region, which is almost two-dimensional and spatially separated from an impurity doping region. According to this structure, electron scattering caused by impurities is suppressed, thus increasing electron mobility in a low temperature and allowing HEMT to operate in a low noise level and in a high speed. However, in such an existing HEMT as described above, it is optical phonon scattering rather than impurity scattering that is dominant as electron scattering in the room temperature. Due to this reason, a HEMT having high electron mobility in the room temperature has not been developed yet.

In order to increase the electron mobility by suppressing impurity scattering, it is necessary to further improve the purity of a crystal. To this end, a very great effort is required to prevent unintended impurity from mixing in. Therefore, it is impossible in fact to attain an electron mobility, which is higher than that of the present one, by suppressing impurity scattering.

SUMMARY OF THE INVENTION

This invention has been made to overcome the above-mentioned problems of a semiconductor device of the prior art.

The object of the invention, therefore, is to provide a semiconductor device which does not need a purity of a crystal higher than that of the present one and makes it possible to attain a high electron mobility in the room temperature.

It is well known in general that a plurality of mini-bands are formed within a potential well according to a periodic structure, which forms a superlattice, and the effective mass of an electron in a mini-band has a different value in each mini-band. Usually, the effective mass in a mini-band of a low energy level is great, and the higher a mini-band is in energy level, the less the effective mass in it is. After careful consideration, the inventor has found that electron mobility can be made higher by reducing the effective mass of an electron, not by lowering the electron scattering as the prior art.

Therefore, a semiconductor device according to the invention is characterized by the fact that a channel layer is formed by combining at least two kind of semiconductor materials, each having a different band gap from the other, so that a superlattice structure, which generates a plurality of mini-bands, is formed. In addition, it is formed that, among these mini-bands, one, which is as high as possible in energy level and is as small as possible in effective mass of electrons, can make an effective contribution to the electron mobility. In actuality, a semiconductor device having high electron mobility has been realized by suitably selecting materials, which forms the periodic structure, a shape of the periodic structure, thickness of the channel layer, and an impurity concentration of an electron supply layer, which supplies the channel layer with electrons.

The above-mentioned superlattice structure may be formed in such a way that two kind of semiconductor materials, each of which has a different band gap to the other, are alternately arranged in an electron moving direction, or both in the electron moving direction and the direction perpendicular to it. In the former case, since mini-bands are formed in the electron moving direction, the effective mass of an electron can be efficiently reduced in this direction. In the latter case, the effective mass of an electron in both directions can be efficiently reduced since mini-band structures are formed in the electron moving direction and the direction perpendicular to it.

One embodiment of the present invention, for example, provides a HEMT in which barrier layers of InAlAs and an electron supply layer of n-type InAlAs are formed on an InP substrate. Further, the channel layer sandwiched by the barrier layers has a periodical structure formed with GaAs regions and InAs regions. In this case, a HEMT having a high electron mobility in the room temperature can be obtained by setting the width of a GaAs region to be 23.476 Å, the width of an InAs region to be 176,070 Å, and the thickness of these regions to be less than 100 Å. And a vicinal substrate having the crystal surface slightly deviated from a certain crystal plane is used as a semiconductor substrate for forming the channel layer on it. As a result, a periodic structure, which forms a superlattice, can be easily attained.

According to the above-mentioned structure, the present invention can provide a semiconductor device having a high electron mobility even in the room temperature without using a high-purity crystal, which has been required by the prior art device to suppress the electron scattering caused by impurities, and so, to higher the electron mobility. In addition, the device can be kept the high electron mobility in high temperature.

BRIEF DESCRIPTION OF THE DRAWINGS

FIG. 8 is a view showing the maximum and the minimum values of energy levels in each mini-band shown in FIG. 7 and the effective mass of electrons in each mini-band in the X-axis direction;

Figure 10:
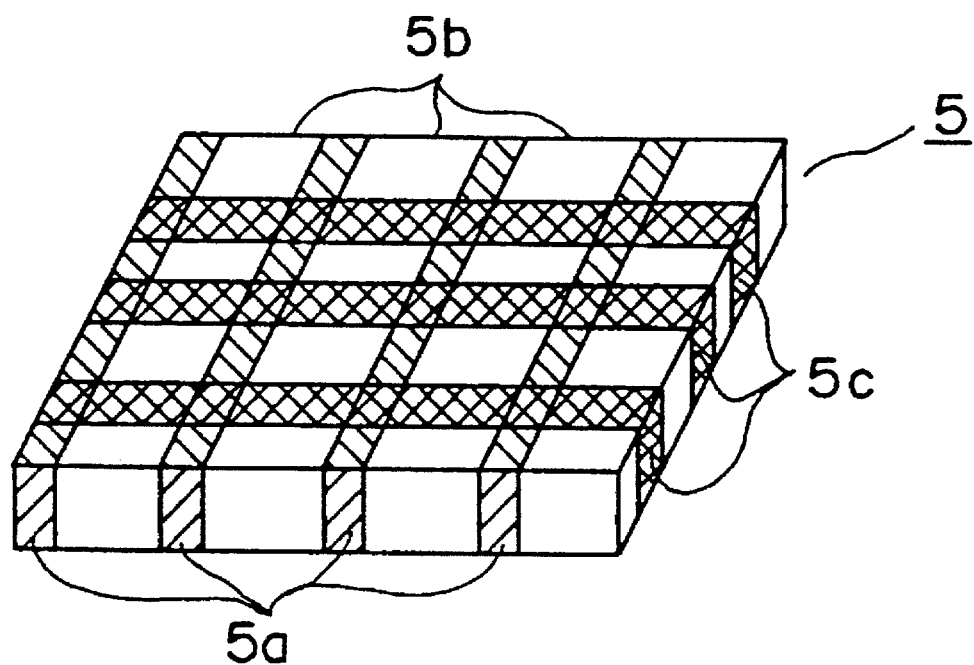
Figure 11:
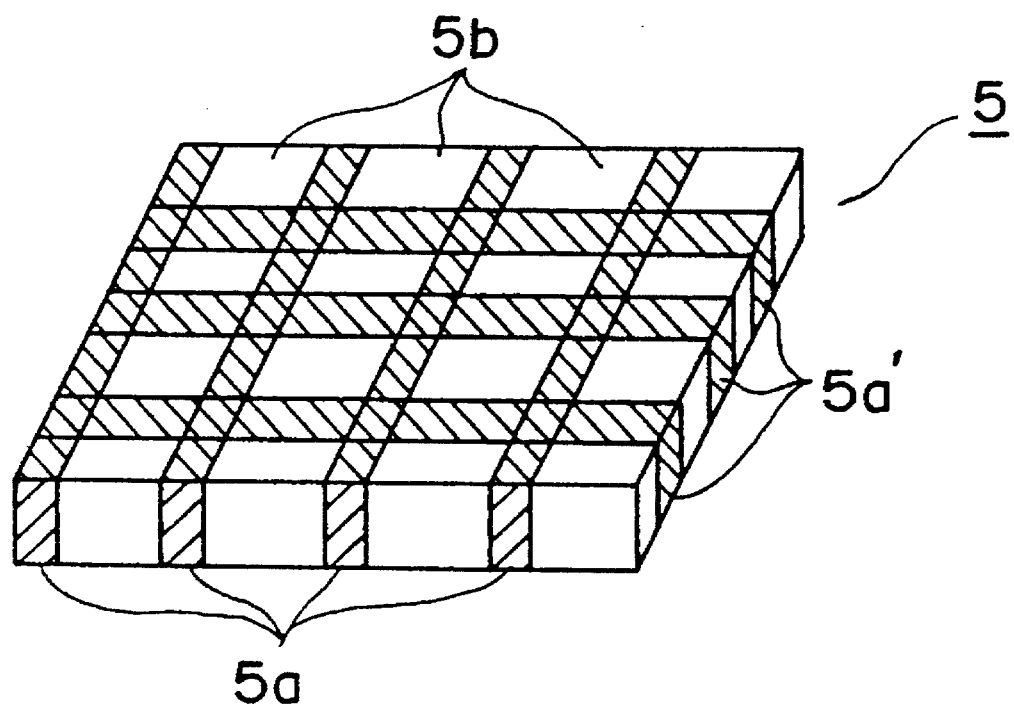

FIGS. 9A to 9E are views showing a method for fabricating a semiconductor device according to the first embodiment of the invention;

FIG. 10 is a perspective view showing the structure of a channel layer in the semiconductor device according to a second embodiment of the invention; and FIG. 11 is a perspective view showing the structure of a channel layer in the semiconductor device according to a third embodiment of the invention.

DETAILED DESCRIPTION OF THE PREFERRED EMBODIMENTS

With referring to the drawings, embodiments of the invention are described below.

Figure 1:
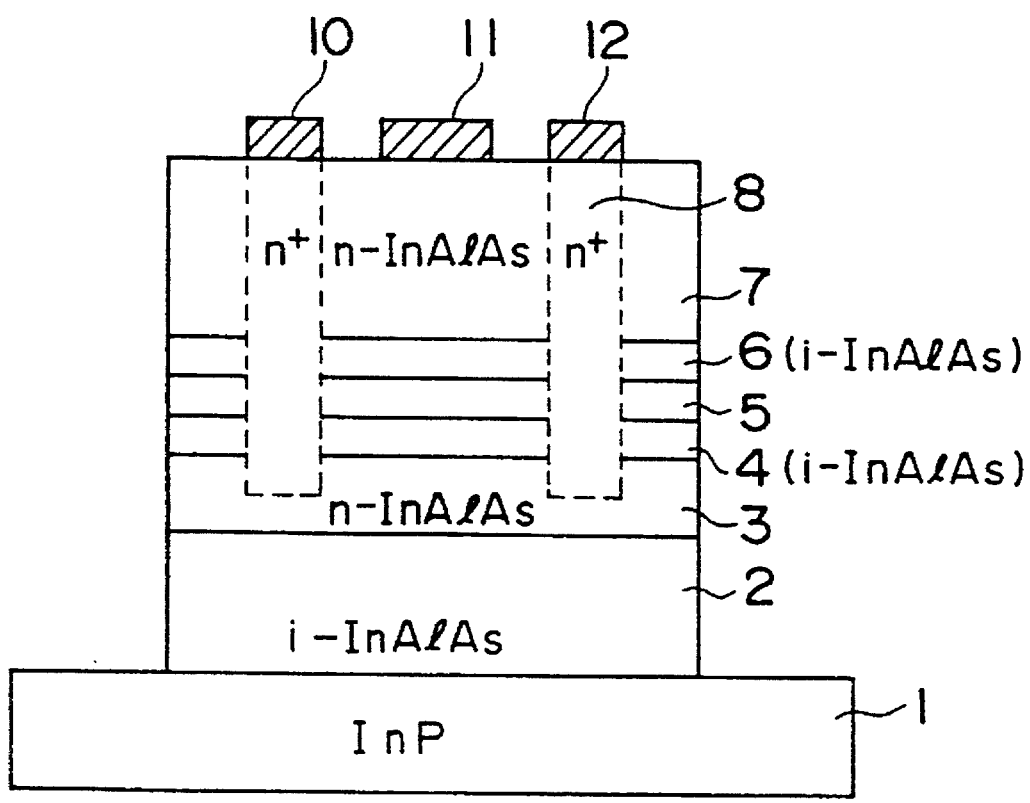
FIG. 1 is a cross-sectional view showing the structure of a semiconductor device according to a first embodiment of the invention.

FIG. 1 is a cross-sectional view showing the structure of a semiconductor device according to a first embodiment of the invention. As shown in the figure, this semiconductor device has an InP vicinal substrate 1, a non-doped $In_{0.52}Al_{0.48}As$ buffer layer 2, an $n-In_{0.52}Al_{0.48}As$ electron supply layer 3 formed on the buffer layer 2, a non-doped $In_{0.52}Al_{0.48}As$ layer 4 formed on the electron supply layer 3, a channel layer 5 formed on the layer 4, a non-doped $In_{0.52}Al_{0.48}As$ layer 6 formed on the channel layer 5, and an $n-In_{0.52}Al_{0.48}As$ electron supply layer 7 formed on the layer 6. The layers 4 and 6 are barrier layers for confining electrons within the channel layer 5. In addition, as shown in this figure, a source and a drain electrodes 10 and 12, and a gate electrode 11 are formed on the semiconductor device. By doping a high concentration of impurities into parts of the layer 7 and the under lying layers, the parts on which the drain and the source electrodes are formed, n+ regions 8 are formed so as to have ohmic contact with the respective electrodes.

Figure 2:
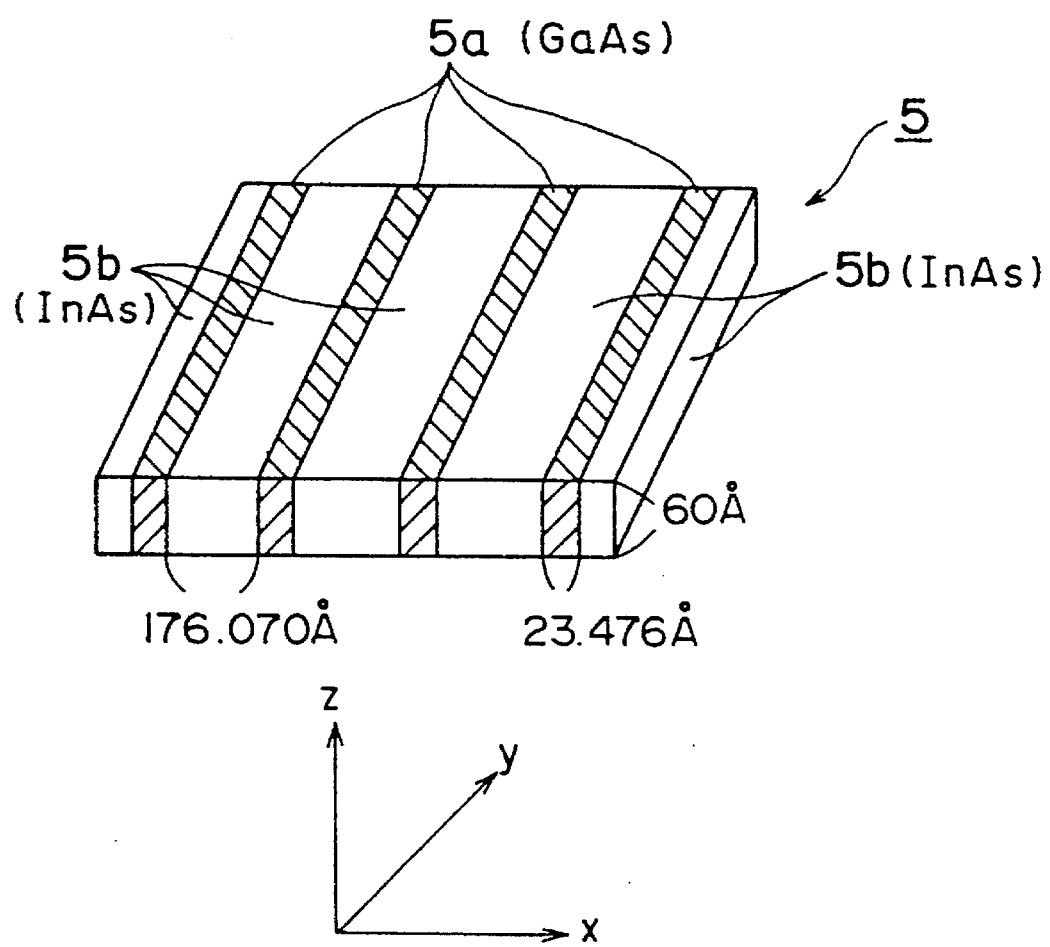
FIG. 2 is a perspective view showing the structure of the channel layer shown in FIG. 1.

FIG. 2 is a perspective view showing the structure of the channel layer 5. As shown in this figure, the channel layer 5 has a structure in which GaAs regions 5a and InAs regions 5b are alternately disposed in parallel with one another between both sides of the channel layer 5. That is to say, supposing that the Z-axis is in the direction of thickness of the channel layer 5, the X-axis is in the moving direction of electrons, and the Y-axis is perpendicular to the X-axis and Z-axis, the GaAs regions 5a are formed in the shape of stripes narrow and long in the Y direction, the stripes being repeated in the X direction. In this embodiment, the channel layer 5 is 60 Å in thickness. Further, each GaAs region 5a is comprised of four molecules of GaAs, that is, 23.476 Å in width, and each InAs region 5b is comprised of 30 molecules of InAs, that is, 176.070 Å in width. Next, the process, how a plurality of mini-bands due to the periodic structure (superlattice structure) of the GaAs regions 5a and the InAs regions 5b in the X direction shown in FIG. 2 are formed within a potential well, will be explained.

Figure 3:
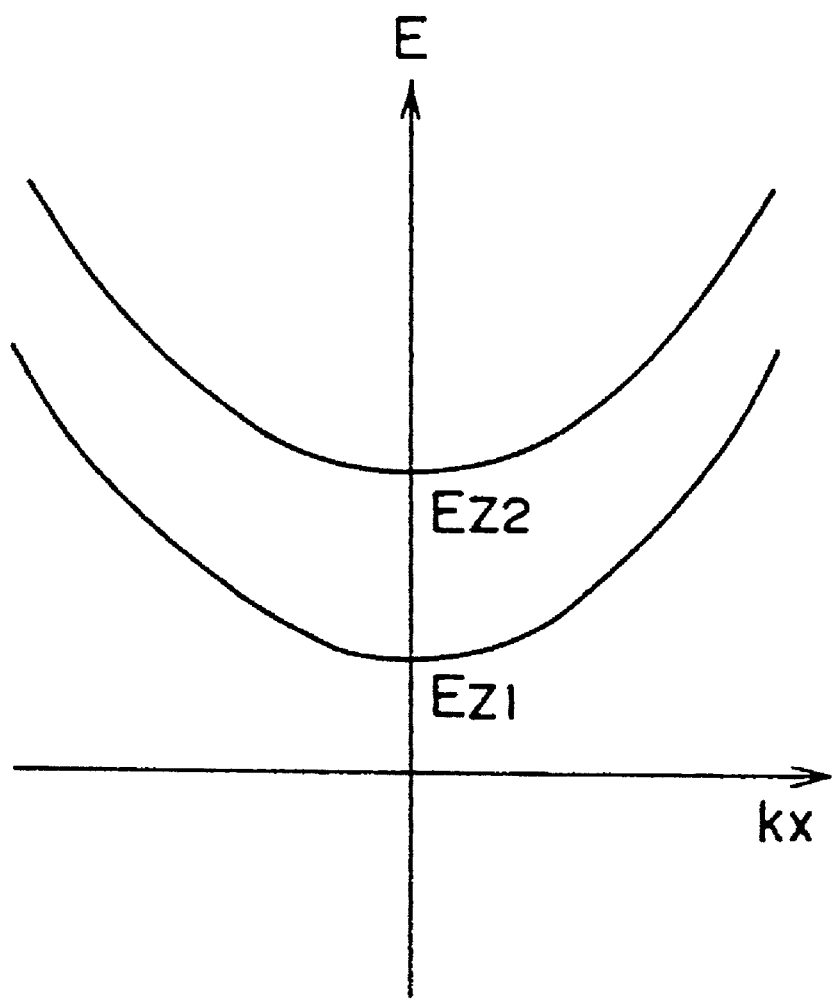
FIG. 3 is an energy level diagram showing a band structure in which kinetic energy of electrons in the X-axis direction is added, in a case where a channel layer is only made of InAs.
Figure 4:
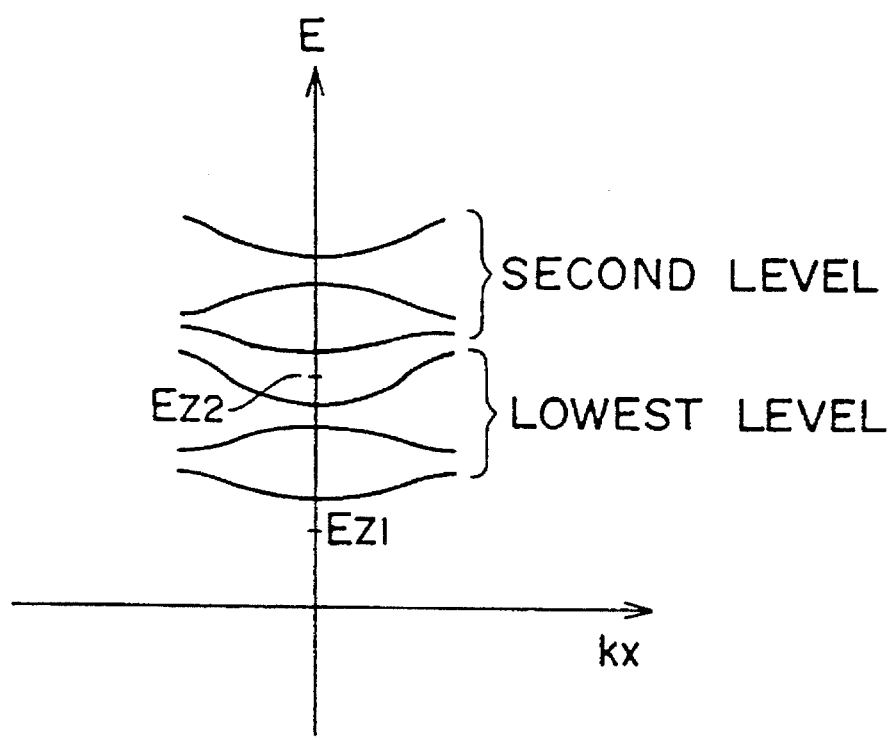
FIG. 4 is an energy level diagram showing a mini-band structure in which each band of the lowest level $EZ_1$ and the second lowest level $EZ_2$ splits when the channel layer has a periodic potential in the X-axis direction.
Figure 5:
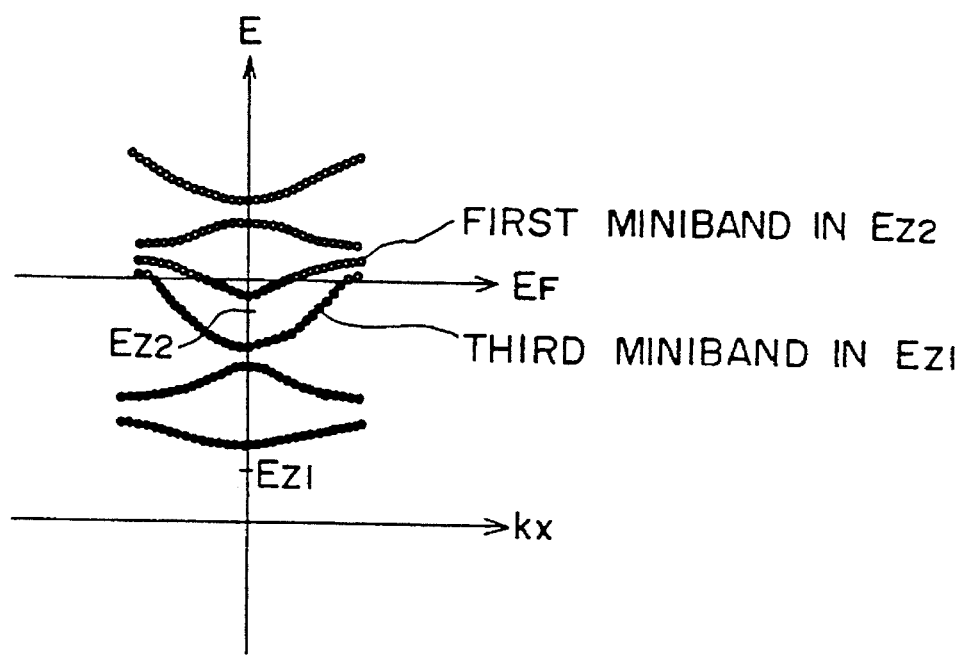
FIG. 5 is an energy level diagram showing a mini-band structure when the maximum value of the third mini-band in the lowest level $EZ_1$ is in the higher energy level side than the first mini-band of the second lowest level $EZ_2$.

Electrons in the channel layer 5 have discontinuous energy levels due to the electron confinement in the Z direction. In this instance, supposing that the lowest level is $Ez_1$ and the second lowest level is $EZ_2$, the channel layer 5 has a band structure shown in FIG. 3 when it is only made of InAs. On the other hand, when the channel layer 5 has the periodic potential in the direction of X-axis, each band in the lowest level $EZ_1$ and the second lowest level $EZ_2$ splits into 3 mini-bands, as shown in FIG. 4. However, in a case where the maximum value of the third mini-band in the lowest level $EZ_1$ comes in the higher energy level than that of the first mini-band in the second lowest level $EZ_2$, electrons may be supplied also into the first mini-band in the second lowest level $EZ_2$, even in a case where the Fermi level exists between the third mini-band in the lowest level $EZ_1$ and the first mini-band in the second lowest level $EZ_2$. As a result, the effective mass of electrons in the first mini-band of the second lowest level $EZ_2$ can make a contribution to the electron mobility. So, it is impossible to obtain a high electron mobility.

Figure 6:
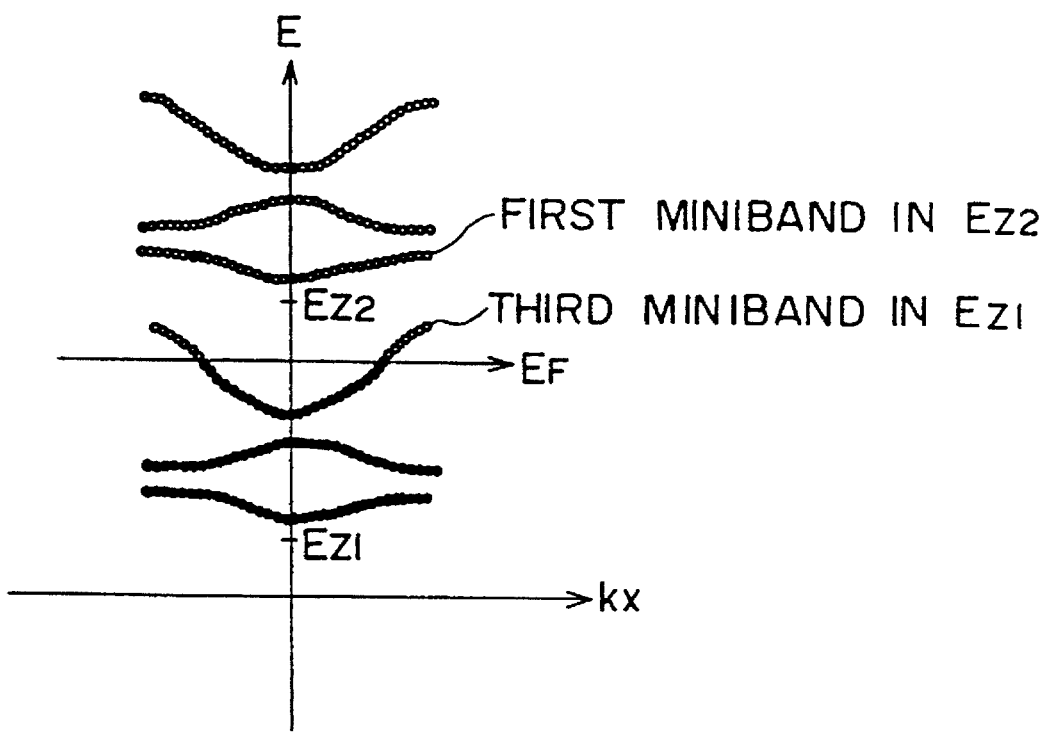
FIG. 6 is an energy level diagram showing a mini-band structure in a case where the energy difference between the second lowest level $EZ_2$ and the lowest level $EZ_1$ is widened.

The thickness of the channel layer 5 in this embodiment may be controlled to be thin enough so that a large energy difference exists between the third mini-band in the lowest level $EZ_1$ and the lowest mini-band in the second lowest level $EZ_2$ as shown in FIG. 6. This makes only the third mini-band in the lowest level $EZ_1$ to make a contribution to carrier movement. For example, when the channel layer 5 is set to be 60 Å in thickness, the lowest level $EZ_1$ becomes 134 (meV) and the second lowest level $EZ_2$ becomes 515 (meV). This satisfies the above condition so that only the third mini-band in the lowest level $EZ_1$ can make a contribution to the carrier movement.

Figure 7:
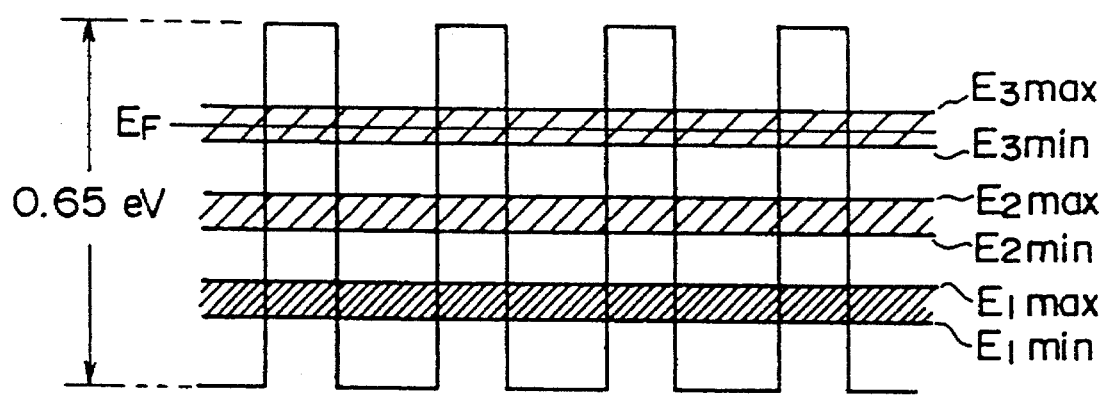
FIG. 7 is an energy level diagram showing the mini-band structure of the lowest level $EZ_1$, the mini-band structure being formed with the periodic structure of GaAs and InAs regions shown in FIG. 2.

FIG. 7 shows the respective mini-bands in the lowest level $EZ_1$ in the device of this embodiment shown in FIGS. 1 and 2. In this device, as described above, computation has been made under the conditions that each GaAs region 5a has a width of 23.476 Å, each InAs region 5b has a width of 176,070 Å, and the discontinuous level in the band is 0.65 (eV). FIG. 8 shows the maximum and the minimum values of energy level in each mini-band shown in FIG. 7 and the effective mass, in the X direction, of an electron in each mini-band. As shown in this figure, the effective mass is 0.067 me in GaAs and 0.023 me in InAs. On the other hand, it is 0.0108 me in the third mini-band, that is less than a half of the effective mass in InAs. Thus, in order to attain a high electron mobility, only the third mini-band can make a contribution to the movement of carriers. To this end, the doping concentration of the electron supply layers 3 and 7 is controlled in a way that the first mini-band and the second mini-band may be filled with electrons and only the third mini-band may have vacancies left for electrons. In this embodiment, a desirable doping concentration is $1.0 \times 10^{12}$ atoms/cm$^2$ for the layer 3 and $1.0 \times 10^{12}$ atoms/cm$^2$ for the layer 7.

Ideally speaking, it is desirable that only the third mini-band can make a contribution to carrier (electron) movement. As is clearly understood from FIG. 8, however, the effective mass of an electron in the second mini-band is not so different from that in the third mini-band. In this case, therefore, the second mini-band can also make a contribution to the carrier movement.

In the above-mentioned embodiment, mini-bands are formed with respect to the electron movement in the X direction by means of a periodic structure in the X direction. On the contrary, mini-bands are not formed in the Y direction. Therefore, energy levels in the Y direction are continuous and the effective mass does not decrease in this direction. The whole effective mass of an electron does not completely agree with the effective mass in the third mini-band of the lowest level $EZ_1$. Since carriers move mainly in the X direction, the effective mass in the X direction can make a large contribution to electron movement. As a result, the effective mass of an electron can be reduced to a considerable degree.

Figure 9A:
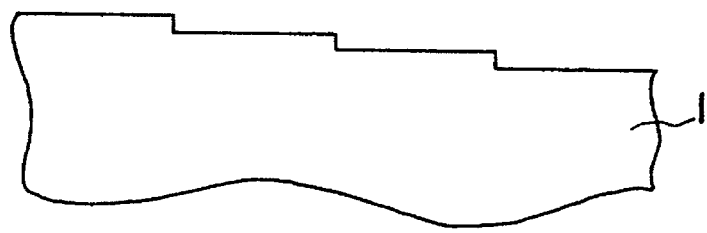
Figure 9B:
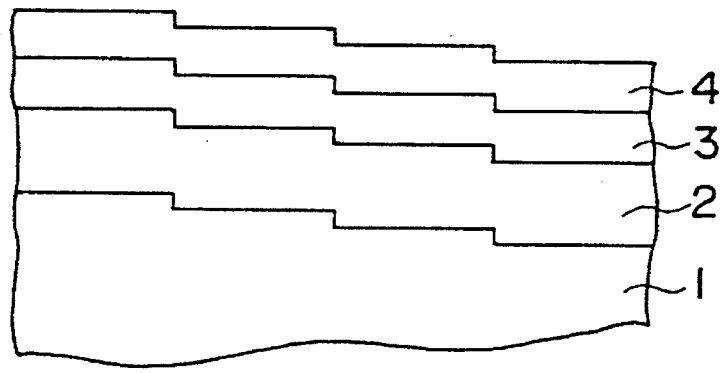
Figure 9C:
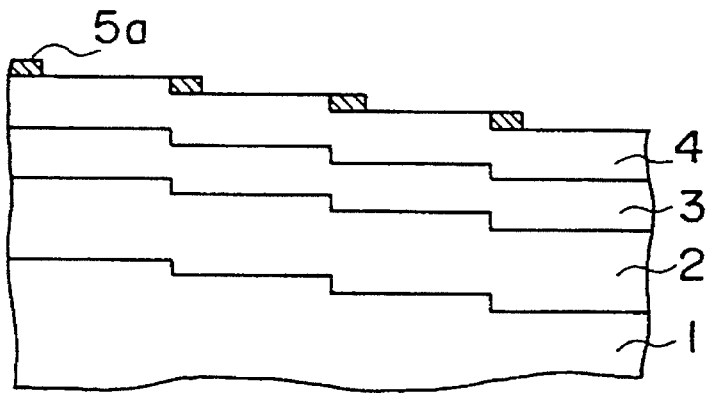
Figure 9D:
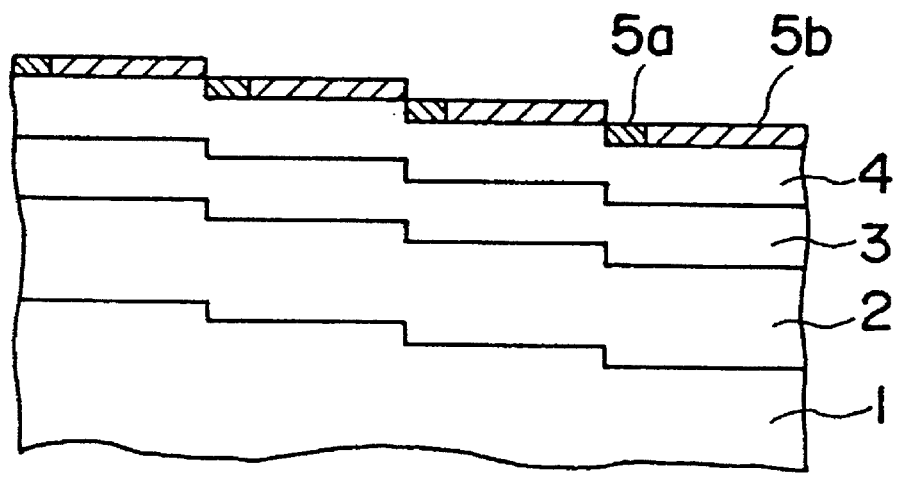

Next, with referring to FIGS. 9A to 9D, a process for fabricating a semiconductor device according to the above-mentioned embodiment is described. In this process, a molecular beam epitaxy is used to grow crystal layers. As shown in FIG. 9A, an InP vicinal substrate 1 (about 450 µm in thickness) is used as a device substrate. The surface orientation of the substrate 1 is inclined by 0.6 degree from the (100) plane to the (110) plane. In a case to grow a crystal layer on the vicinal substrate, the surface of the substrate becomes step-shaped as shown in FIG. 9A. In this embodiment, since the inclination angle is 0.6 degree, each step is 199.546 Å in width. In the next step, as shown in FIG. 9B, a non-doped $In_{0.52}Al_{0.48}As$ layer 2 (0.5 µm in thickness), an n-$In_{0.52}Al_{0.48}As$ electron supply layer 3 (0.03 µm in thickness) and a non-doped $In_{0.52}Al_{0.48}As$ layer 4 (0.01 µm in thickness) are formed one after another on the InP vicinal substrate 1. Then, as shown in FIG. 9C, GaAs regions 5a are formed on the layer 4 by molecular beam epitaxy. Each GaAs region 5a is formed by 4 molecules of GaAs. Since the surface of the layer 4 is step-shaped, GaAs is deposited onto the vertical wall part of each step to grow each GaAs region in the horizontal direction. Therefore, each GaAs region 5a has a width of 4 molecules of GaAs, that is, 23.467 Å. Thereafter, as shown in FIG. 9D, InAs regions 5b are formed by molecular beam epitaxy. In the same way as that for forming the GaAs regions, 30 molecules of InAs, that is, 176.070 Å in width, are deposited on each remaining part of the non-doped $In_{0.52}Al_{0.48}As$ layer 4. On these parts, no GaAs region 5a has been formed.

Figure 9E:
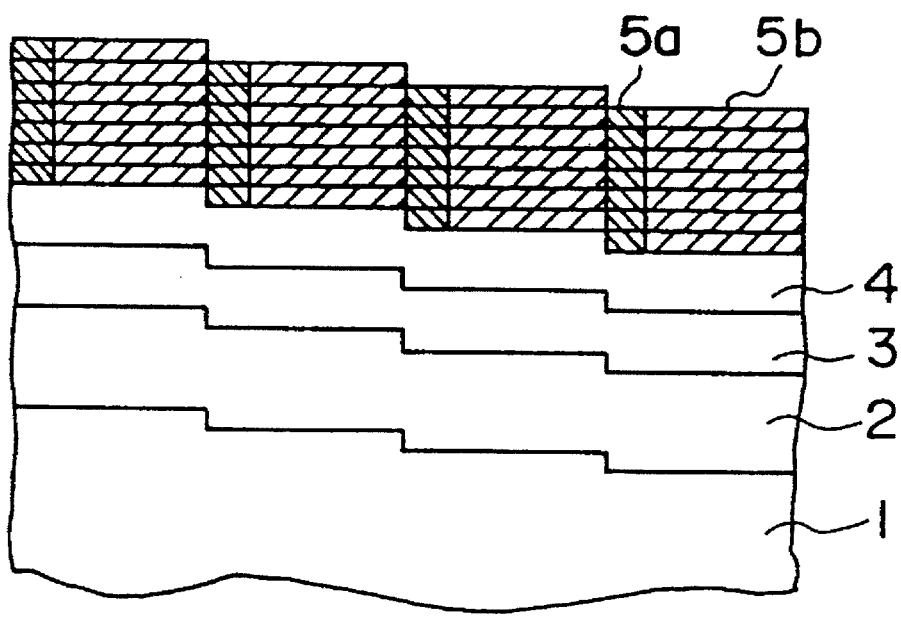

Thereafter, a channel layer 5 is formed as shown in FIG. 9E by repeating the formation of the GaAs regions 5a and the InAs regions 5b alternately until the channel layer 5 reaches 60 Å in thickness. Then, although not shown in the figure, a non-doped $In_{0.52}Al_{0.48}As$ layer 6 (0.01 µm in thickness) and an $In_{0.52}Al_{0.48}AS$ layer 7 (0.03 µm in thickness) are formed one after another on the channel layer 5. A source and a drain electrodes 10 and 12, and a gate electrode 11 are formed on layer 7 so as to construct a transistor. In this case, by selectively doping Ge or the like under the source and the drain electrodes 10 and 12 of the transistor, n+ regions 8 are formed to have ohmic contact with the respective electrodes. Thus, a HEMT having the channel layer 5 shown in FIG. 2 is obtained.

As described above, this embodiment produces minibands by forming the channel layer 5 to be a periodic structure in which GaAs regions 5a and InAs regions 5b are formed alternately in the X direction of this layer 5. At the same time, this embodiment controls the doping concentration in the InAlAs layers 3 and 7, which supply channel layer 5 with electrons, so that only one mini-band or mini-bands, in which the effective mass of an electron is small enough, can make a contribution to electron movement. As a result, the effective mass of an electron in the X direction can be substantially reduced, thus realizing high electron mobility even in the room temperature without depending on temperature and without requiring further purification of a crystal.

Next, a second embodiment of the invention is described with referring to FIG. 10.

The above-mentioned first embodiment attains a high electron mobility by reducing effective mass of electrons in the X direction. However, electrons move also in the Y direction. This embodiment blocks electron movement in the Y direction by providing a plurality of stripe-shaped InAlAs regions 5c in parallel with the X direction of the channel layer 5. In other words, the stripe-shaped InAlAs regions 5c formed in parallel with the X direction produce quantum barriers to block electron movement in the Y direction. This substantially limits the electron movement within the X direction. As a result, the second embodiment can attain a higher electron mobility than that of the first embodiment.

Next, the third embodiment of the invention is described with referring to FIG. 11.

The above mentioned first embodiment reduces the effective mass of an electron only in the X direction of the channel layer. On the contrary, the third embodiment substantially reduces the effective mass of an electron in the Y direction as well as in the X direction of the channel layer 5. To this end, as shown in FIG. 11, the third embodiment forms periodically a plurality of stripe-shaped GaAs regions 5a' in the Y direction in addition to the periodical GaAs regions 5a formed in the X direction. According to this structure, the third embodiment can reduce the effective mass of an electron not only in the X direction but in the Y direction, thus accomplishing a higher electron mobility than that of the first embodiment.

The above-mentioned three embodiments form InAlAs layers on an InP substrate, however, materials of these layers are not limited to them. For example, GaAs may be used as a substrate material and AlGaAs may be used as a grown layer material. Furthermore, not only the combination of GaAs and InAs but also GaAs and AlGaAs, for example, can be used as the materials for the channel layer 5.

What is claimed is:

1. A semiconductor device having a superlattice structure, comprising:

a semiconductor substrate having a main surface;

a first barrier layer of a first semiconductor material formed above said main surface of the semiconductor substrate;

a channel layer formed on the first barrier layer and having a main electron movement direction which is parallel to said main surface of the semiconductor substrate, said channel layer having a superlattice structure including a first region made of a second semiconductor material and a second region made of a third semiconductor material whose band gap is smaller than that of the second semiconductor material, said first region having a larger width than that of the second region, and said first and second regions being periodically repeated in said main electron movement direction within said channel layer;

a second barrier layer of a fourth semiconductor material formed on said channel layer; and an electron supply layer of a fifth semiconductor material formed on said second barrier layer.

2. The semiconductor device as claimed in claim 1, wherein said channel layer further has a plurality of quantum barrier regions which are formed to be periodically repeated in the direction perpendicular to said first and second regions.

3. The semiconductor device as claimed in claim 1, wherein said channel layer further has a plurality of third regions made of the second semiconductor material, said third regions being formed by periodically repeating said second semiconductor material in the direction perpendicular to said first and second regions.

4. The semiconductor device as claimed in claim 1,wherein said first, fourth, and fifth semiconductor materials are InAlAs, said second semiconductor material is GaAs, and said third semiconductor material is InAs.

5. The semiconductor device as claimed in claim 4, wherein said channel layer is less than 100 Å in thickness, said first region is about 23,476 Å in width, and said second region is about 176,070 Å in width.

6. The semiconductor device as claimed in claim 4, wherein said substrate is made of a vicinal substrate of InP whose crystal orientation is inclined by about 0.6 degree from a (100) plane to a (110) plane.

7. The semiconductor device as claimed in claim 1, wherein said electron supply layer has n type conductivity.

8. The semiconductor device as claimed in claim 1, wherein said electron supply layer has a source, a drain, and a gate electrodes formed thereon.

9. The semiconductor device as claimed in claim 1, wherein a second electron supply layer is further provided between said substrate and said first barrier layer.

10. The semiconductor device as claimed in claim 1, wherein said first semiconductor material is AlGaAs, said second semiconductor material is GaAs, and said third semiconductor material is AlGaAs.

11. The semiconductor device as claimed in claim 1, wherein said first region is made from GaAs and said second region is made from InAs.

* * * * *